US006765418B2

(12) United States Patent
Murata

(10) Patent No.: US 6,765,418 B2
(45) Date of Patent: Jul. 20, 2004

(54) CLOCK SUPPLY BIAS CIRCUIT AND SINGLE-PHASE CLOCK DRIVE FREQUENCY DIVIDING CIRCUIT USING THE SAME

(75) Inventor: Glenn Keiji Murata, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/099,276

(22) Filed: Mar. 14, 2002

(65) Prior Publication Data

US 2002/0163367 A1 Nov. 7, 2002

(30) Foreign Application Priority Data

Mar. 14, 2001 (JP) ........................................ 2001-072538

(51) Int. Cl.[7] ............................................. H03K 25/00
(52) U.S. Cl. ...................................... 327/115; 327/117
(58) Field of Search ................................ 327/175, 113, 327/114, 115, 117, 118, 295, 171, 291, 296–297, 178; 377/47, 48

(56) References Cited

U.S. PATENT DOCUMENTS

| 5,894,214 A | * | 4/1999 | Jiang | ........................... 323/222 |
| 6,064,236 A | * | 5/2000 | Kuwata et al. | ................ 327/12 |
| 6,092,211 A | * | 7/2000 | Hozumi | ....................... 713/500 |
| 6,363,465 B1 | * | 3/2002 | Toda | ........................... 711/169 |
| 6,501,311 B2 | * | 12/2002 | Lutkemeyer | ................ 327/161 |

FOREIGN PATENT DOCUMENTS

EP 484921 A1 * 5/1992 ............ H03K/5/08

* cited by examiner

Primary Examiner—Timothy P. Callahan
Assistant Examiner—Cassandra Cox
(74) Attorney, Agent, or Firm—Choate, Hall & Stewart

(57) ABSTRACT

A single-phase clock CLK0 is divided into a clock signal CLK1 to drive nMOS transistor and a clock signal CLK2 to drive pMOS transistor, and the resulting clock signals are inputted to DFF circuits 1 to 3 constituting a frequency dividing circuit, making gms of nMOS and pMOS transistors larger than that could be achieved using the conventional technique. Therefore, frequency dividing performance can be greatly improved in comparison with that achieved using conventional technology.

15 Claims, 10 Drawing Sheets

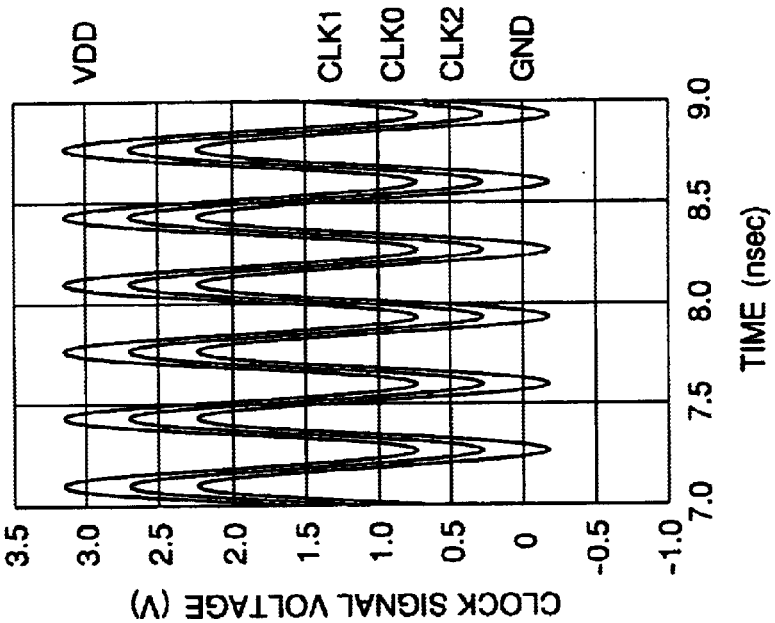
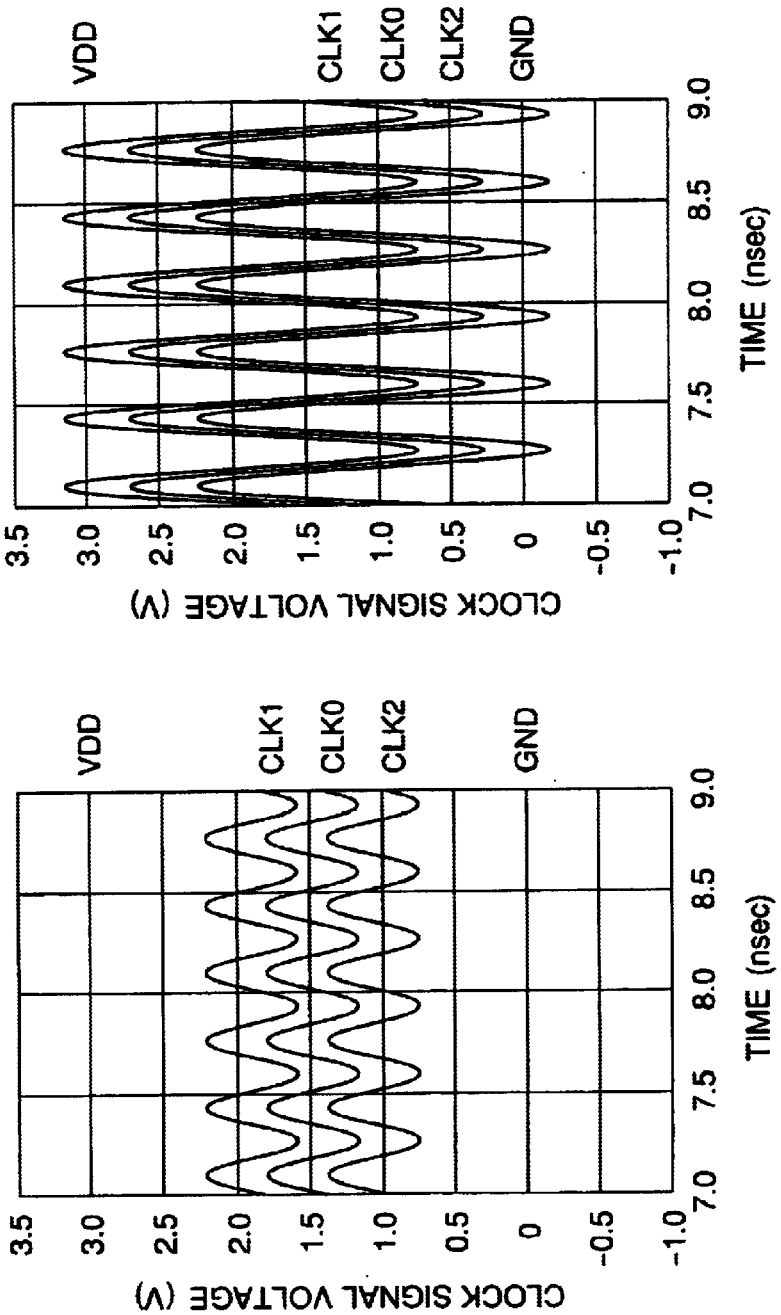

US 6,765,418 B2

CLOCK SUPPLY BIAS CIRCUIT AND SINGLE-PHASE CLOCK DRIVE FREQUENCY DIVIDING CIRCUIT USING THE SAME

BACKGROUND OF THE INVENTION

1. Field of the Invention

The present invention relates to a clock supply bias circuit for a prescaler (frequency dividing circuit) driven by a single-phase clock, and more particularly, to a clock supply bias circuit for a prescaler having a CMOS structure.

2. Description of the Prior Art

In recent years, in RF front-end ICs for mobile communication and broadband communication, there are increasing needs for system IC and cost reduction.

Conventionally, the BiCMOS process capable of integrating a bipolar transistor having an excellent high-frequency characteristic and a CMOS appropriate to high-integration digital circuit into 1 chip has been used in forming an LSI RF front end. In accordance with recent development of finer and high frequency CMOS, an RF unit using CMOS has been developed.

The CMOS RF unit is advantageous in that a complete 1-chip system IC in which CMOS constitutes a baseband unit as well as an RF unit can be realized, and that the IC can be manufactured through a reduced number of process steps in comparison with the BiCMOS process.

The RF front end requires a frequency synthesizer for channel selection. The frequency synthesizer is constructed employing a prescaler, a counter, a phase comparator, a charge pump and the like therein. Especially, the prescaler to which an RF signal is inputted requires a high frequency characteristic.

Conventionally, to realize the high-frequency prescaler, the BiCMOS process has been mainly employed, and an LSI prescaler operating at frequencies up to 3 GHz has been realized.

Furthermore, to realize a high-speed prescaler employing CMOS, the Extended True-Single-Phase-Clock (E-TSPC) technique has been proposed as a technique for achieving high speed, high integration and low electric consumption. However, the maximum operation frequency to be achieved by this technique is about 3 GHz.

FIG. 1 shows the construction of a ⅛ frequency dividing prescaler using the E-TSPC technique.

As shown in FIG. 1, in the ⅛ frequency dividing prescaler, a single-phase clock signal is inputted from a clock terminal CLK indicated by a bold line, through a clock input line, into nMOS transistors N51, N53 and a pMOS transistor P53 of DFF1, an nMOS transistor N71 and a pMOS transistor P72 of DFF2, nMOS transistors N91, N93 and a pMOS transistor P93 of DFF3, a pMOS transistor P54 of a NOR circuit, an nMOS transistor N59 and pMOS transistor P57 of a BUFF (buffer) circuit. In this case, to make the nMOS and pMOS transistors have their maximum drive capability, generally a clock voltage of the single-phase clock signal is set at a value between a positive power-supply voltage VDD and a negative power-supply voltage VSS, as shown in the figure.

However, in the case where the clock voltage consisting of the single-phase clock signal is used and an input signal frequency is divided by 2 in the prescaler, a frequency dividing characteristic of the DFF circuit presents dependency on input signal frequency as shown in FIG. 9.

As shown in FIG. 9, when the input signal frequency is 3.813 GHz or higher, the signal frequency cannot be divided.

In consideration of the recent trend that 5 GHz band frequencies typified such as by IEEE 802.11a to communicate using radio frequency has gradually been available and therefore, an ultra-fast prescaler has strongly been required to operate at high frequencies up to 5 GHz using CMOS, the frequency characteristic of full-CMOS prescaler has to be further improved.

Accordingly, there arises a problem that the conventional full-CMOS prescaler using the clock voltage of the conventional single-phase clock signal operates in response to the input signal frequency only up to 3.813 GHz and therefore, cannot address the needs for the operation thereof in higher input signal frequencies in the future.

SUMMARY OF THE INVENTION

The present invention has its object to provide a clock supply bias circuit, in which an input signal frequency of a single-phase clock drive frequency dividing circuit can be increased in use of a clock voltage of single-phase clock signal, and a single-phase clock drive frequency dividing circuit using the clock supply bias circuit.

The clock supply bias circuit constructed in accordance with the present invention comprises an clock input terminal for receiving a single-phase clock as an input signal and clock output terminals for outputting the input signal as a first clock and a second clock, in which the first clock and the second clock are constructed such that the first clock and the second clock have the same phase as that of the single-phase clock and have different voltages, respectively.

In more detail, the clock supply bias circuit of the present invention is further constructed as follows. That is, the clock supply bias circuit is further constructed such that a first capacitor is connected in series to a positive power supply via a first current control element and disposed between the clock input terminal and a positive power supply, a second capacitor is connected in series to a negative power supply via a second current control element and disposed between the clock input terminal and the negative power supply, a first resistor is connected in parallel with the first capacitor, a second resistor is connected in parallel with the second capacitor, a diode is connected in parallel with the first capacitor and the second capacitor being connected in series, an anode of the diode serves as an output terminal to output the first clock, and a cathode of the diode serves as an output terminal to output the second clock.

In the conventional frequency dividing circuit, the single-phase clock is supplied to gates of nMOS and pMOS transistors of DFF circuit. On the other hand, in a case where the above-described clock supply bias circuit of the present invention is used in the frequency dividing circuit, the clock bias circuit supplies a clock signal in such a manner that a voltage applied to the gate of nMOS transistor of DFF circuit with respect to the p well thereof and a voltage applied to the gate of pMOS transistor of the DFF circuit with respect to the n well thereof are both made larger than that could be achieved using the single-phase clock in the conventional frequency dividing circuit. As a result, the transistors can operate showing gm thereof greatly improved in comparison with that could be achieved in the conventional frequency dividing circuit.

The frequency dividing circuit driven by single-phase clock constructed in accordance with the present invention using the above-described clock supply bias circuit, comprises: a first DFF circuit, a second DFF circuit and a third DFF circuit each consisting of a MOS transistor, a NOR circuit, a NAND circuit, an output buffer circuit and a clock supply bias-circuit, all of the circuits being connected in parallel with each other between a positive power supply and a negative power supply, and the first DFF circuit, the second DFF circuit and the third DFF circuit further being constructed such that all of the DFF circuits are driven by clocks supplied by the clock supply bias circuit, in which the clock supply bias circuit further comprises:

a clock input terminal;

a first capacitor connected in series to the positive power supply via a first current control element and disposed between the clock input terminal and the positive power supply;

a second capacitor connected in series to the negative power supply via a second current control element and disposed between the clock input terminal and the negative power supply;

a first resistor connected in parallel with the first capacitor;

a second resistor connected in parallel with the second capacitor; and a diode connected in parallel with the first capacitor and the second capacitor being connected in series, the clock supply bias circuit further being constructed such that an anode of the diode serves as a first clock output line and a cathode of the diode serves as a second clock output line, the first DFF circuit, the second DFF circuit and the third DFF circuit are further constructed such that all of the DFF circuits consist of the same circuit configuration and each of the DFF circuits further comprises:

a first pMOS transistor having a source connected to the positive power supply, a drain connected to a drain of a first nMOS transistor and a gate of a second pMOS transistor, and a gate connected to a data input signal line and a gate of a second nMOS transistor;

the first nMOS transistor having a source connected to a drain of the second nMOS transistor, and a gate connected to a gate of a third nMOS transistor and the first clock output line;

the second pMOS transistor having a source connected to the positive power supply, and a drain connected to a drain of the third nMOS transistor and a gate of a fourth nMOS transistor;

the second nMOS transistor having a source connected to the negative power supply;

the third pMOS transistor having a source connected to the positive power supply, a drain connected to a drain of the fourth nMOS transistor and an output signal line, and a gate connected to the second clock output line;

the third nMOS transistor having a source connected to the negative power supply; and the fourth nMOS transistor having a source connected to the negative power supply, the NOR circuit comprises:

a fourth pMOS transistor having a source connected to the positive power supply, a drain connected to a drain of a fifth nMOS transistor, a drain of a sixth nMOS transistor and the data input signal line of the first DFF circuit, and a gate connected to a gate of the sixth nMOS transistor and the output signal line of the third DFF circuit;

the fifth nMOS transistor having a gate connected to a signal input terminal, and a source connected to the negative power supply; and the sixth nMOS transistor having a source connected to the negative power supply, the NAND circuit comprises:

a fifth pMOS transistor having a source connected to the positive power supply, a drain connected to a drain of a seventh nMOS transistor and the data input signal line of the second DFF circuit, and a gate connected to a gate of the seventh nMOS transistor and the output signal line of the third DFF circuit;

the seventh nMOS transistor having a source connected to a drain of an eighth nMOS transistor; and the eighth nMOS transistor having a source connected to the negative power supply, and a gate connected to the output signal line of the first DFF circuit, the output buffer circuit comprises:

a sixth pMOS transistor having a source connected to the positive power supply, a drain connected to a drain of a ninth nMOS transistor, a gate of a seventh pMOS transistor, a gate of a tenth nMOS transistor and the second output signal terminal, and a gate connected to a gate of the ninth nMOS transistor, the output signal line of the second DFF circuit and the data input signal line of the third DFF circuit;

the ninth nMOS transistor having a source connected to the negative power supply;

the seventh pMOS transistor having a drain connected to a drain of the tenth nMOS transistor and the first output signal terminal; and the tenth nMOS transistor having a source connected to the negative power supply.

As described above, the frequency dividing circuit driven by single-phase clock through the clock supply bias circuit constructed in accordance with the present invention has the following advantages. That is, first, the single-phase clock inputted to the clock supply bias circuit is divided into the associated clock signals to drive nMOS and pMOS transistors, and the resulting clock signals are inputted to the frequency dividing circuit. Thereafter, the resulting clock signals thus created for the nMOS and pMOS transistors by dividing the single-phase clock signal make respective gm of the nMOS and pMOS transistors larger than that could be achieved using the conventional single-phase clock. Accordingly, the frequency dividing performance can be extensively improved in comparison to that observed in the conventional technology.

BRIEF DESCRIPTION OF THE DRAWINGS

FIGS. 8A and 8B are graphs showing signal waveforms of a clock signal at input/output terminals of the clock supply bias circuit constructed in accordance with the embodiment of the present invention;

DETAILED DESCRIPTION OF THE PREFERRED EMBODIMENT

Figure 2:
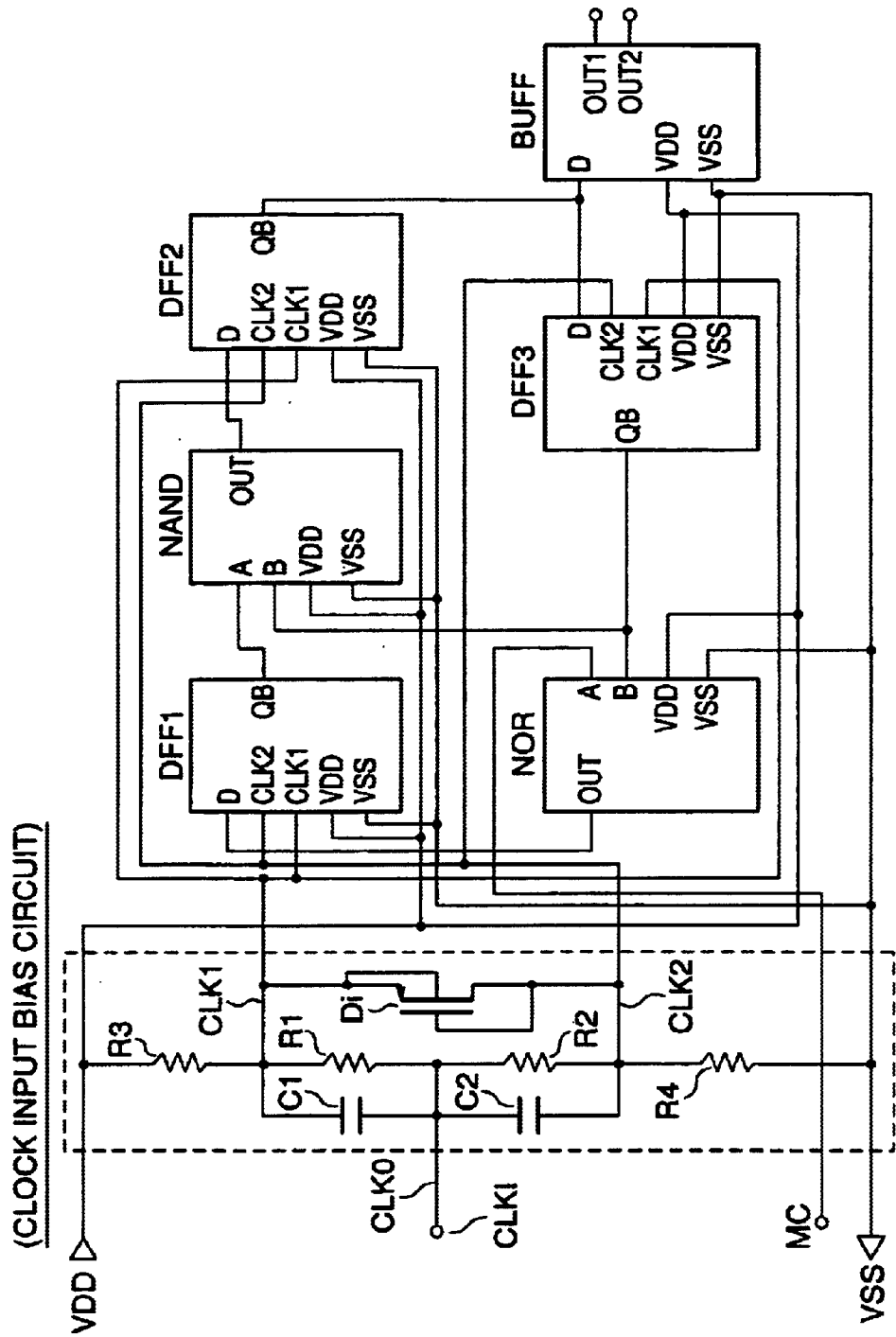
FIG. 2 is a block diagram showing a frequency dividing circuit driven by single-phase clock, constructed in accordance with the embodiment of the present invention.
Figure 3:
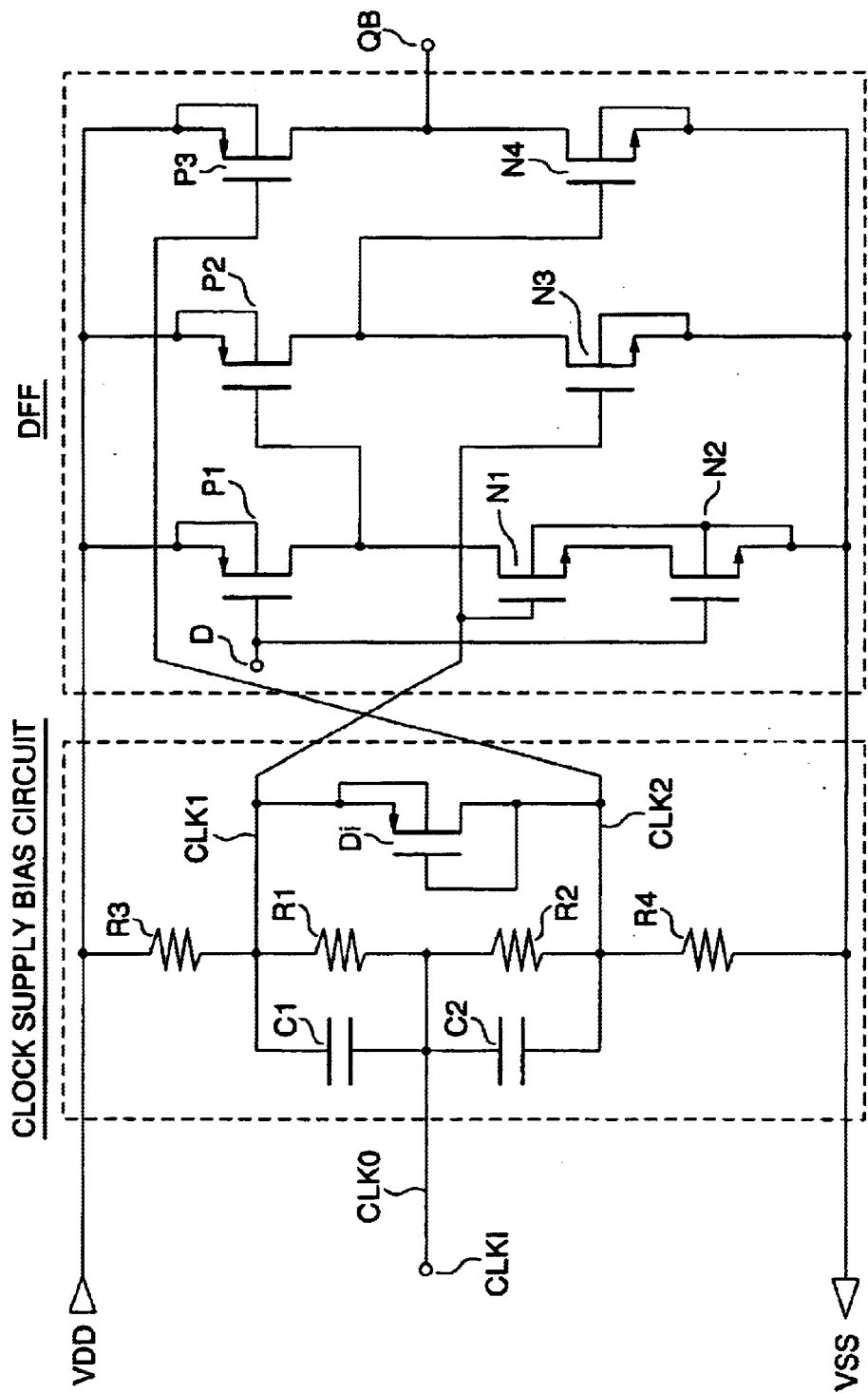
FIG. 3 is a circuit diagram showing a clock supply bias circuit constructed in accordance with the embodiment of the present invention and a DFF circuit in the frequency dividing circuit driven by single-phase clock, the DFF being driven by the clock supply bias circuit.
Figure 4:
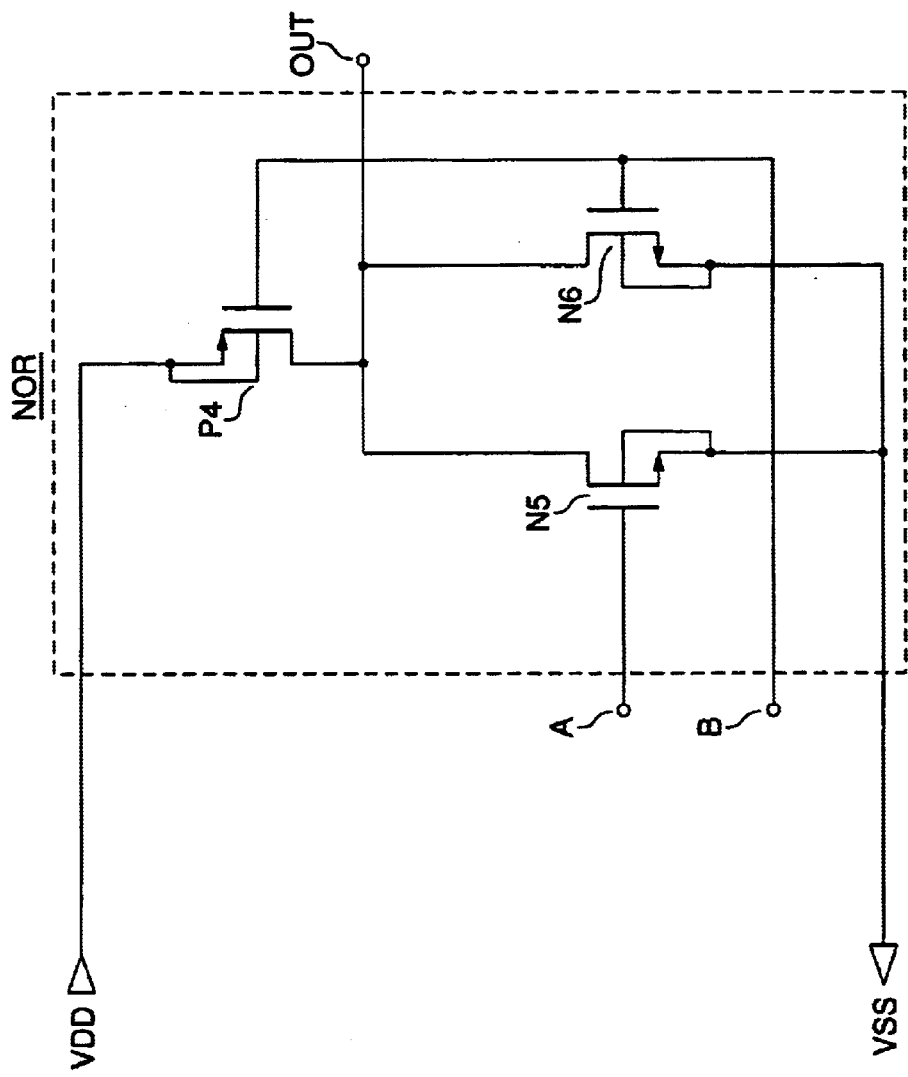
FIG. 4 is a circuit diagram showing a NOR circuit employed in the frequency dividing circuit driven by single-clock drive, the frequency dividing circuit being constructed in accordance with the embodiment of the present invention.
Figure 5:
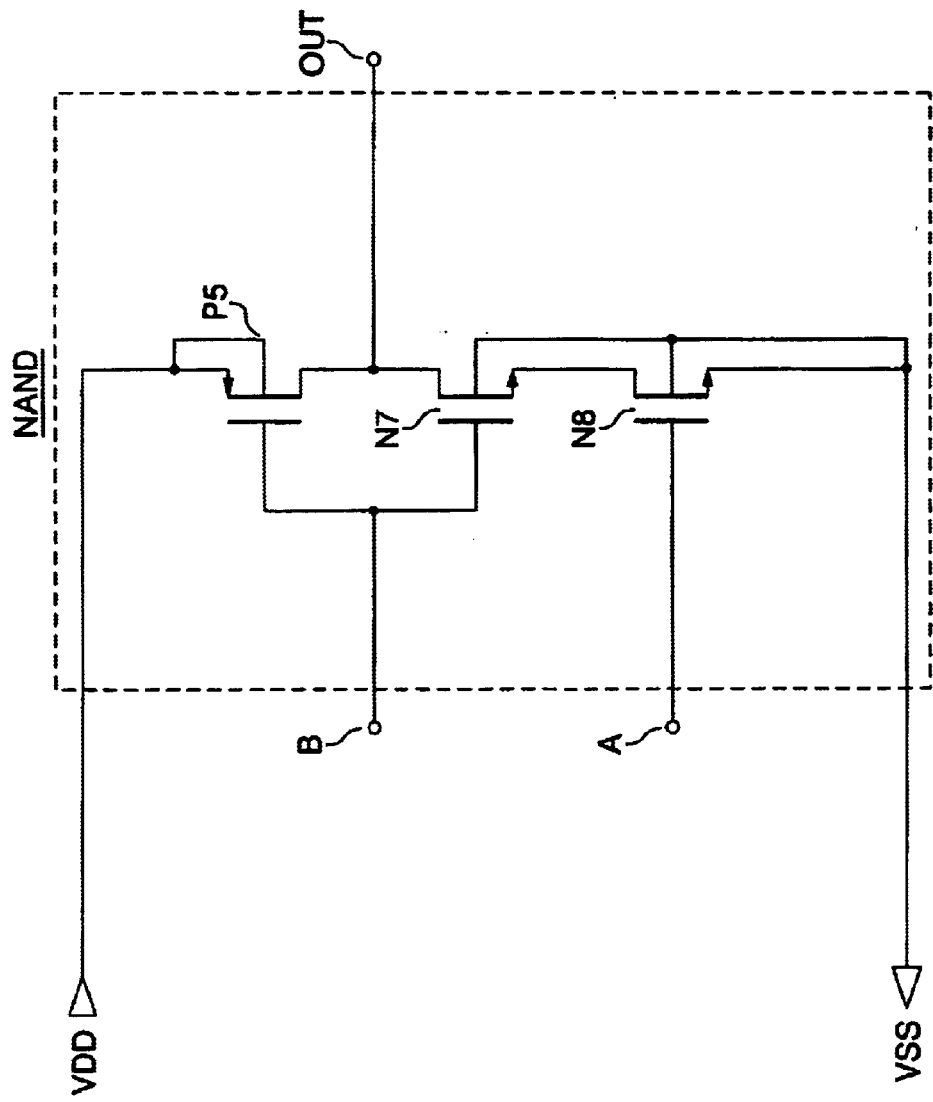
FIG. 5 is a circuit diagram showing a NAND circuit employed in the frequency dividing circuit driven by single-clock, the frequency dividing circuit being constructed in accordance with the embodiment of the present invention.
Figure 6:
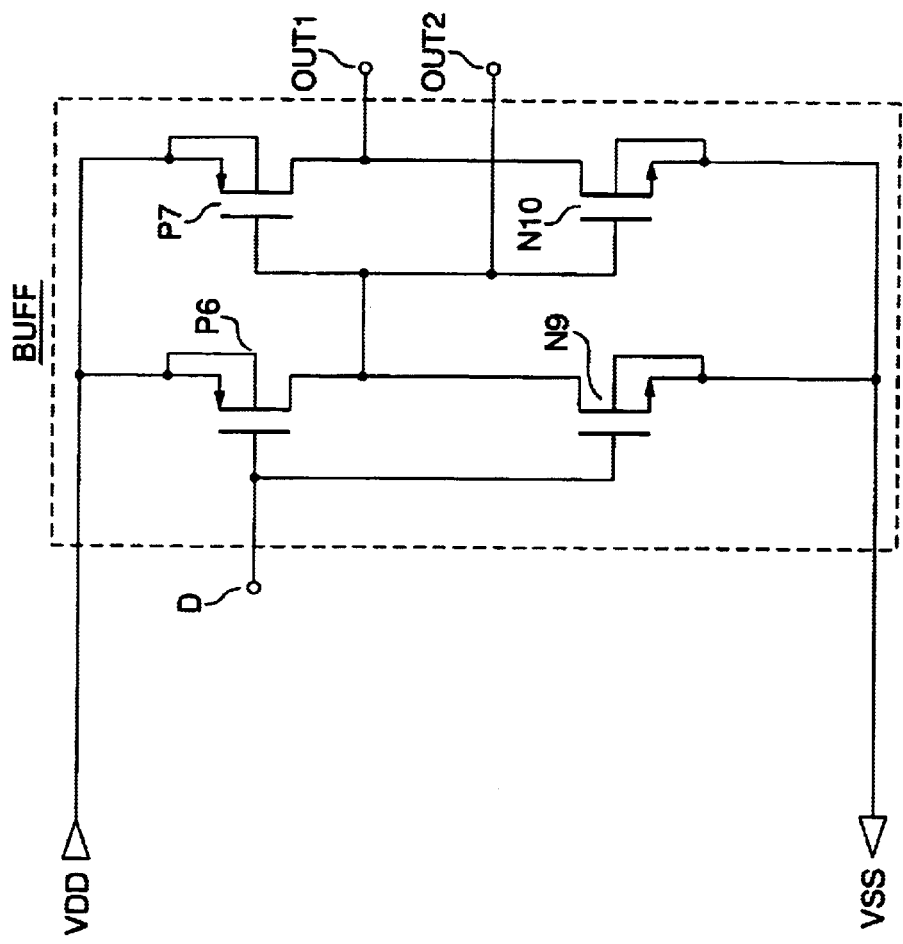
FIG. 6 is a circuit diagram showing a BUFF circuit employed in the frequency dividing circuit driven by single-clock, the frequency dividing circuit constructed in accordance with the embodiment of the present invention.

A preferred embodiment of the present invention will now be described in detail in accordance with FIGS. 2 to 10. FIG. 2 is a whole circuit diagram comprised of a clock supply bias circuit and a frequency dividing circuit driven by single-phase clock and employing the clock supply bias circuit. In the figure, the clock supply bias circuit is indicated by elements, and the others are indicated by blocks. Furthermore, as shown in FIG. 2, all clocks outputted from the clock supply bias circuit are inputted into associated DFF circuits. Therefore, to clearly show the connections between the clock supply bias circuit and the DFF circuits, a detailed circuit diagram indicating elements thereof is shown in FIG. 3. FIGS. 4 to 6 are circuit diagrams respectively of a NOR circuit, a NAND circuit and a BUFF circuit of FIG. 2, all of which are indicated by elements.

As shown in FIG. 2, an input signal inputted into an MC terminal is passed through DFF1, DFF2, DFF3, the NOR circuit, the NAND circuit and finally to the BUFF circuit. In this case, the input signal is frequency-divided to be outputted to OUT1 and OUT2 terminals of the BUFF circuit. Symbol MC denotes a terminal for an input signal.

The clock supply bias circuit comprises resistors R1 and R2 in series and connected in parallel to a pMOS diode Di, capacitors C1 and C2 in series, a resistor R3 between the pMOS diode Di and a positive power supply VDD and a resistor R4 between the pMOS diode Di and a negative power supply (or ground) VSS. The capacitors C1, C2 are designed such that gate capacitance connected to the terminals CLK1 and CLK2 can be ignored in comparison to capacitance of the capacitors C1, C2, the gate capacitance being obtained by summing up capacitance of all transistors connected thereto.

In the present embodiment, although a pMOS diode is employed as the diode of the clock supply bias circuit, any other diode such as an NMOS diode, a junction diode or a TFT diode may be employed.

Furthermore, in the present embodiment, although the resistors R3, R4 are used as current limiting elements inserted between the pMOS diode and the power supply, the resistors may be replaced by an active load consisting of a transistor or constant-current supply.

As shown in FIG. 3, when a single-phase clock signal CLK0 is inputted into a terminal CLKI of the clock supply bias circuit, the signal is divided by the capacitors C1 and C2 into a clock signal CLK1 on the Di side of the capacitor C1 and a clock signal CLK2 on the Di side of the capacitor C2. The clock signal CLK1 is outputted from the clock supply bias circuit and inputted into the gate of an nMOS transistor N3 of the DFF circuit, while the clock signal CLK2 is outputted from the clock supply bias circuit and inputted into the gate of a pMOS transistor P3 of the DFF circuit.

In the conventional circuit for supplying single-phase clock, the same voltage is applied to the gates of nMOS and pMOS transistors of DFF circuit. On the other hand, the clock supply bias circuit constructed in accordance with the present invention supplies a clock signal to apply a voltage to the gate of the nMOS transistor N3 of the DFF circuit with respect to the p well thereof higher than that applied in the conventional circuit, while supplying a clock signal to apply a voltage to the gate of the pMOS transistor P3 of the DFF circuit with respect to the n well thereof lower than that applied in the conventional circuit.

Figure 1:
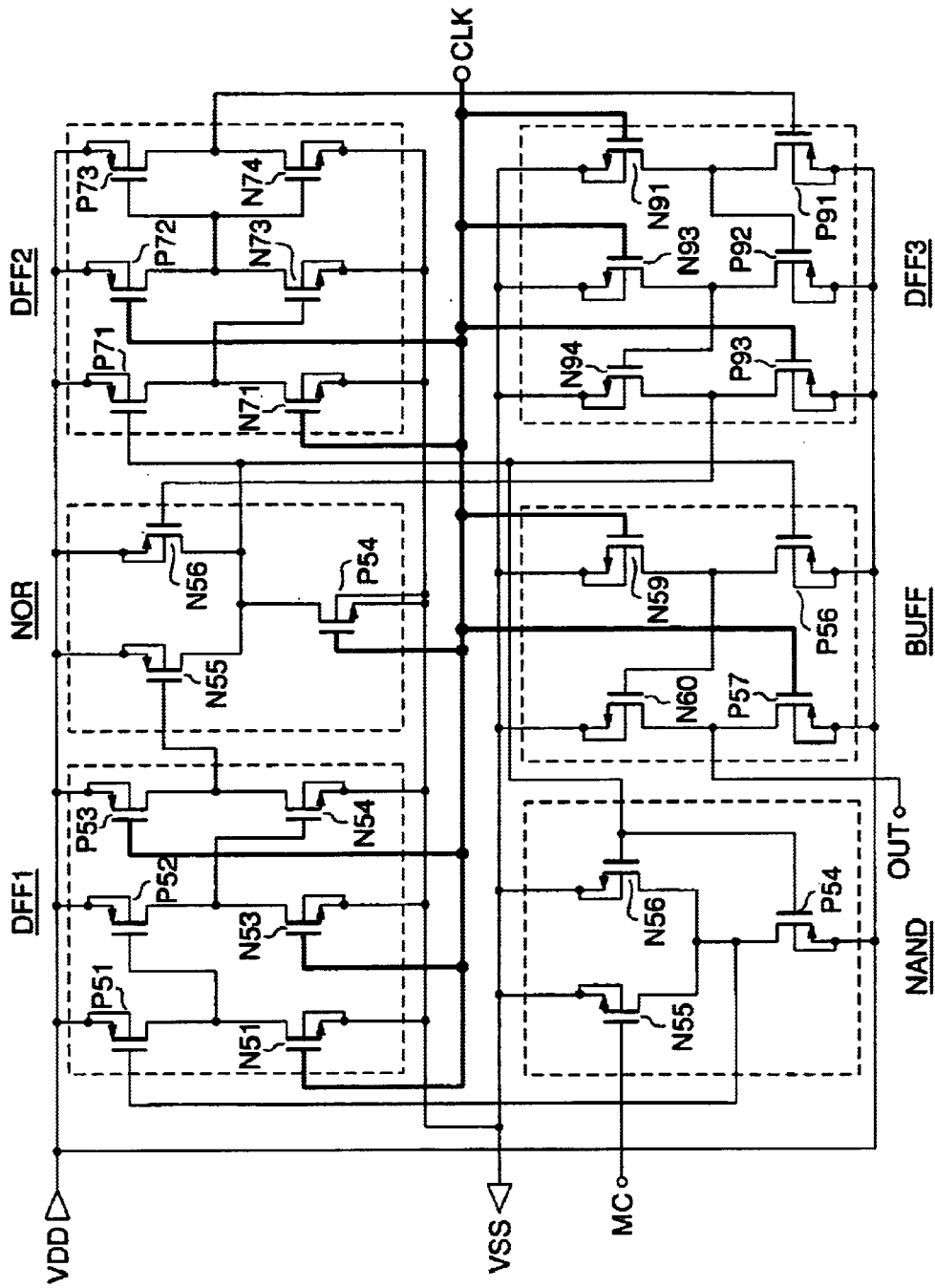
FIG. 1 is a circuit diagram showing a conventional frequency dividing circuit driven by single-phase clock.
Figure 7B:
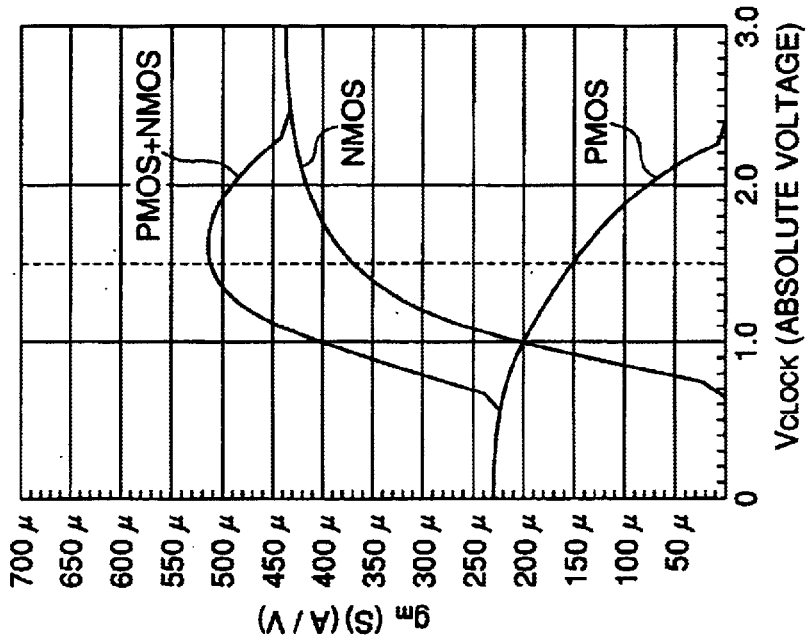
FIGS. 7A and 7B are graphs showing conductance of transistors used in a DFF circuit in the frequency dividing circuit driven by single-phase clock, the frequency dividing circuit constructed in accordance with the embodiment of the present invention.
Figure 7A:
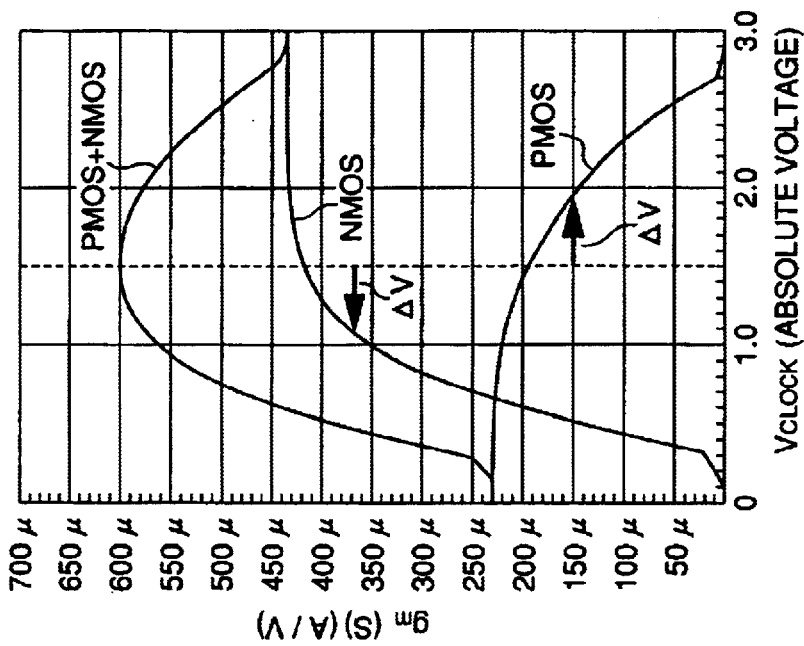

FIGS. 7A and 7B are graphs to indicate the difference between gm curves obtained by measuring both types of transistors of DFF driven by a clock supply circuit constructed in accordance with the present invention and the conventional technique. That is, the nMOS transistor N3 and the pMOS transistor P3 of the DFF circuit driven by the clock supply bias circuit (FIG. 7A), and the nMOS transistor N53 and the pMOS transistor P53 of the DFF1 circuit of FIG. 1 driven by the conventional single-phase clock (FIG. 7B) are measured.

FIGS. 7A and 7B illustrate gm curves measured under the condition of VDD=+3.0 V and VSS–0 V. As shown in FIG. 7B, to drive both types of transistors of DFF using the conventional single-phase clock, the clock signal voltage is set at a value of 1.5 V such that the both types of transistors are able to show their maximum gm. On the other hand, as shown in FIG. 7A, according to the method for driving both types of transistors of DFF using the clock supply bias circuit constructed in accordance with the present invention, the gm curves of the nMOS transistor and the pMOS transistor respectively shift leftward and rightward as indicated by bold arrows in the figure. As a result, when the single-phase clock signal also used as the conventional single-phase clock signal is inputted into the terminal CLK1, a total gm obtained by summing the gm of the nMOS transistor and the gm of the pMOS transistor increases from 510 $\mu\Omega^{-1}$, which is the value obtained in the conventional frequency dividing circuit, to 600 $\mu\Omega^{-1}$.

The extent to which the gm obtained in accordance with the present invention is improved can be expressed by drain currents I of the nMOS and pMOS transistors, the drain currents I being represented by the following equations where the voltage of the clock signal CLK0 is Vclk, a threshold voltage is Vth, a shift voltage is delta. V, unit capacitance of a gate oxide film is Cox, a gate length is l, a gate width is w, and other constant is uo:

$$I_n = \frac{1}{2} u_{o\cdot NMOS} C_{ox} \frac{\omega}{1} \left[ \left( V_{clk} + \frac{|V_{th\cdot PMOS}|}{2} \right) - |V_{th\cdot NMOS}| \right]^2$$

$$I_p = \frac{1}{2} u_{o\cdot PMOS} C_{ox} \frac{\omega}{1} \left[ \left( V_{clk} + \frac{|V_{th\cdot PMOS}|}{2} \right) \right]^2$$

The above expressions tell that the drain current Ip of the pMOS transistor varies depending only on the threshold voltage of the pMOS, while the drain current In of the nMOS transistor varies depending on the threshold voltages of the pMOS and nMOS transistors.

Accordingly, taking into account of variation of threshold voltage resulted from variation of the process for manufacturing the pMOS and nMOS transistors, the shift voltage delta. V shifted from the clock signal voltage and the threshold voltages of the pMOS and nMOS transistors are set at values to satisfy the following relation:

$$|V_{th\text{-}NMOS}| \geq \Delta V = \frac{|V_{th\text{-}PMOS}|}{2}$$

Furthermore, FIGS. 8A and 8B are graphs showing the clock signals CLK1 and CLK2 outputted from the clock supply bias circuit as a result of the single-phase clock signal being inputted to a terminal CLKI of the clock supply bias circuit and then divided within the clock supply bias circuit. The clock supply bias circuit of the present invention is characterized as follows. That is, the clock supply bias circuit can provide a bias point to increase gm of the nMOS and pMOS transistors of the DFF circuit that is driven by the single-phase clock signal, and in addition, as shown in FIGS. 8A, 8B, when CLK0 itself increases, the value of CLK1 exceeds the positive power-supply voltage VDD and the value of CLK2 becomes lower than the negative power-supply voltage VSS because of the existence of the capacitors C1, C2. This phenomenon tells that the clock supply bias circuit can apply a voltage higher than the power-supply voltage to the gates of the nMOS and pMOS transistors of the DFF circuit, thereby allowing the nMOS and pMOS transistors of the DFF circuit to operate on a large bias current.

Figure 9:
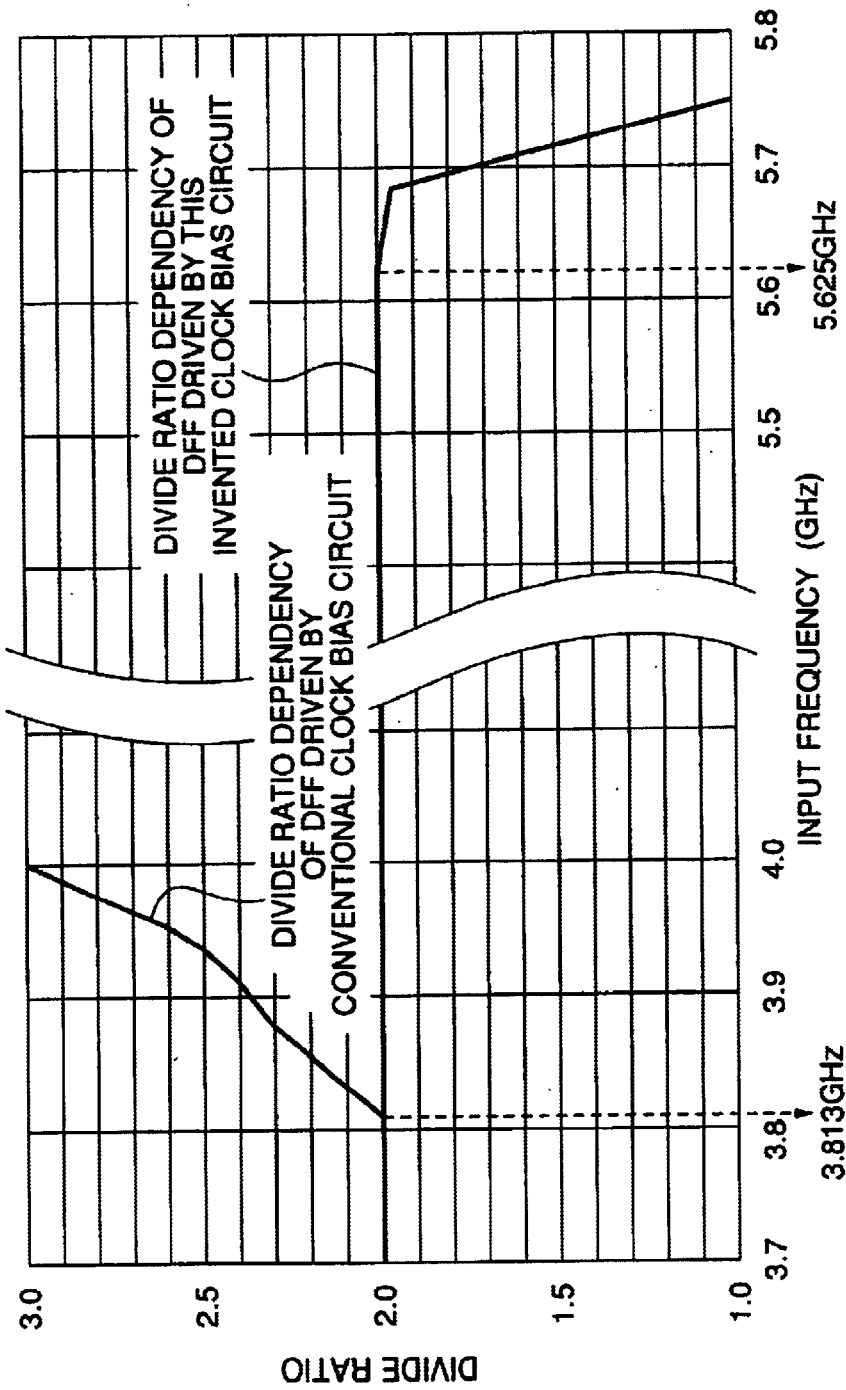
FIG. 9 is a graph showing a frequency dividing characteristic of the DFF circuit in the frequency dividing circuit driven by single-phase clock, the frequency dividing circuit constructed in accordance with the embodiment of the present invention.

FIG. 9 shows a frequency characteristic of the DFF circuit in a case where the input signal frequency is divided by 2. In FIG. 9, a curve where a flat line extending to a high-frequency area shows the frequency characteristic of the DFF circuit driven by the single-phase clock signal using the clock supply bias circuit of the present invention, and a curve where a flat line terminates in a low-frequency area shows the frequency characteristic of the DFF circuit driven by the conventional single-phase clock signal. As is understood from the figure, the DFF circuit driven by the conventional single-phase clock signal is available as a commercial circuit up to 3.813 GHz with respect to the input signal frequency, on the other hand, the DFF circuit driven by the single-phase clock signal through the clock supply bias circuit of the present invention is available as a commercial circuit up to 5.625 GHz with respect to the input signal frequency.

Figure 10A:
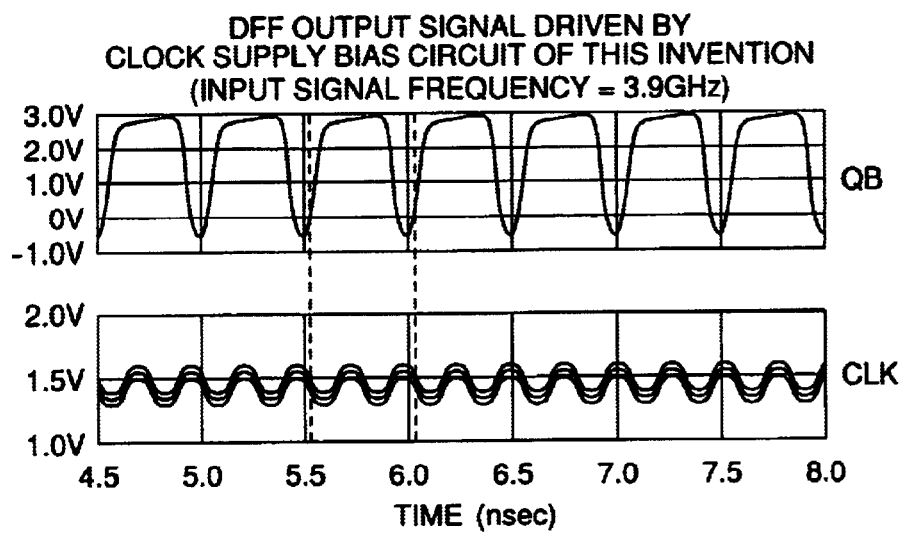
FIGS. 10A and 10B are graphs showing signal waveforms of a clock signal at input/output terminals of the DFF circuit in the frequency dividing circuit driven by single-phase clock, the frequency dividing circuit constructed in accordance with the embodiment of the present invention.
Figure 10B:
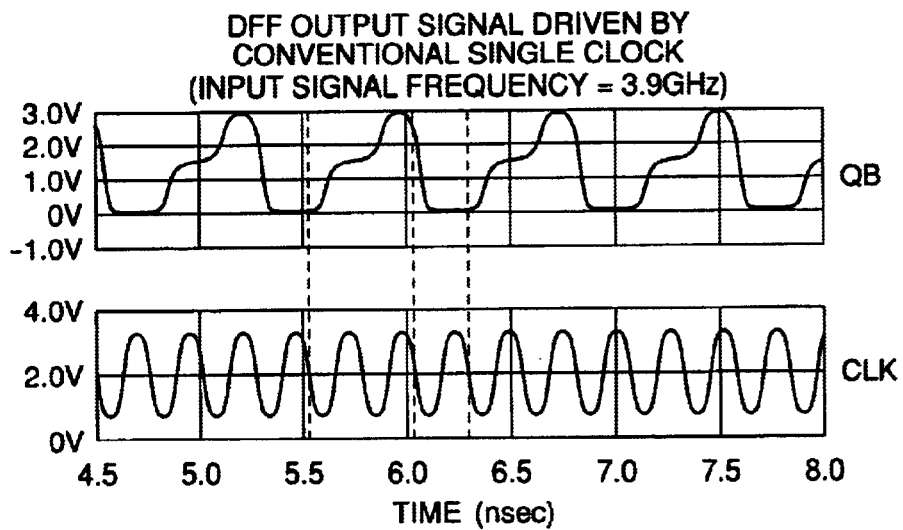

FIGS. 10A and 10B show waveforms of the frequency dividing characteristics in a case where the input signal frequency is 3.9 GHz. FIG. 10A shows an input signal waveform (lower) and an output signal waveform (upper) of the DFF circuit using the clock supply bias circuit of the present invention. FIG. 10B shows an input signal waveform (lower) and an output signal waveform (upper) of the DFF circuit driven by the conventional single-phase clock signal.

As is understood from these waveforms, in the case where the clock supply bias circuit of the present invention is used in the frequency dividing circuit driven by single-phase clock, the frequency of input signal is completely divided by two, on the other hand, in the case of the conventional single-phase clock signal is used in the frequency dividing circuit driven by single-phase clock, the frequency of input signal is completely divided by not two but three, meaning the frequency dividing circuit driven by the conventional single-phase clock signal cannot be available as a commercial circuit.

As described above, in the frequency dividing circuit driven by single-phase clock through the clock supply bias circuit of the present invention, the single-phase clock signal inputted to the clock supply bias circuit is respectively divided into clock signals to drive the nMOS and pMOS transistors, and then, the resulting clock signals are inputted to the frequency dividing circuit. Thereafter, the resulting clock signals thus created for the nMOS and pMOS transistors by dividing the single-phase clock signal make respective gm of the nMOS and pMOS transistors larger than that could be achieved using the conventional single-phase clock. Accordingly, the frequency dividing performance can be largely improved in comparison to that could be achieved in the conventional technology.

As described above, the frequency dividing circuit driven by single-phase clock through the clock supply bias circuit constructed in accordance with the present invention has the following advantages. That is, first, the single-phase clock inputted to the clock supply bias circuit is divided into the associated clock signals to drive nMOS and pMOS transistors, and the resulting clock signals are inputted to the frequency dividing circuit. Thereafter, the resulting clock signals thus created for the nMOS and pMOS transistors by dividing the single-phase clock signal make respective gm of the nMOS and pMOS transistors larger than that could be achieved using the conventional single-phase clock. Accordingly, the frequency dividing performance can be extensively improved in comparison to that observed in the conventional technology.

What is claimed is:

1. A clock supply bias circuit comprising:

a clock input terminal for receiving a single-phase clock having a clock signal voltage as an input signal and clock output terminals for outputting said input signal as a first clock and a second clock, said first clock and said second clock being constructed such that said first clock and said second clock have the same phase as that of said single-phase clock and have different voltages, a first clock voltage and a second clock voltage, wherein said first clock voltage and said second clock voltage are each shifted from said clock signal voltage by a shift voltage amount and wherein said first clock voltage and said second clock voltage differ from each other by two times said shift voltage amount.

2. A clock supply bias circuit, comprising:

a clock input terminal for receiving a single-phase clock as an input signal and clock output terminals for outputting said input signal as a first clock and a second clock, said first clock and said second clock being constructed such that said first clock and said second clock have the same phase as that of said single-phase clock and have different voltages, respectively, wherein said clock supply bias circuit is further constructed such that a first capacitor connected in series to a positive power supply via a first current control element and disposed between said clock input terminal and a positive power supply, a second capacitor connected in series to a negative power supply via a second current control element and disposed between said clock input terminal and said negative power supply, a first resistor connected in parallel with said first capacitor, a second resistor connected in parallel with said second capacitor, and a diode connected in parallel with said first capacitor and said second capacitor being connected in series, and an anode of said diode serves as an output terminal to output said first clock, and a cathode of said diode serves as an output terminal to output said second clock.

3. The clock supply bias circuit according to claim 2, wherein said first current control element and said second current control element are constant-current sources, both current control elements being comprised of a MOS transistor.

4. The clock supply bias circuit according to claim 2, wherein said first current control element and said second current control element are resistors.

5. A frequency dividing circuit driven by single-phase clock, comprising: a first DFF circuit, a second DFF circuit and a third DFF circuit each consisting of a MOS transistor, a NOR circuit, a NAND circuit, an output buffer circuit and a clock supply bias circuit, all of said circuits being connected in parallel with each other between a positive power supply and a negative power supply, and said first DFF circuit, said second DFF circuit and said third DFF circuit further being constructed such that all of said DFF circuits are driven by clocks supplied by said clock supply bias circuit, said clock supply bias circuit further comprising:
a clock input terminal;
a first capacitor connected in series to said positive power supply via a first current control element and disposed between said clock input terminal and said positive power supply;
a second capacitor connected in series to said negative power supply via a second current control element and disposed between said clock input terminal and said negative power supply;
a first resistor connected in parallel with said first capacitor; a second resistor connected in parallel with said second capacitor; and
a diode connected in parallel with said first capacitor and said second capacitor being connected in series, said clock supply bias circuit further being constructed such that an anode of said diode serves as a first clock output line
and a cathode of said diode serves as a second clock output line,
said first DFF circuit, said second DFF circuit and said third DFF circuit being further constructed such that all of said DFF circuits consist of the same circuit configuration and each of said DFF circuits further comprises:
a first pMOS transistor having a source connected to said positive power supply, a drain connected to a drain of a first nMOS transistor and a gate of a second pMOS transistor, and a gate connected to a data input signal line and a gate of a second nMOS transistor;
said first nMOS transistor having a source connected to a drain of said second nMOS transistor, and a gate connected to a gate of a third nMOS transistor and said first clock output line;
said second pMOS transistor having a source connected to said positive power supply, and a drain connected to a drain of said third nMOS transistor and a gate of a fourth nMOS transistor;
said second pMOS transistor having a source connected to said negative power supply;
a third pMOS transistor having a source connected to said positive power supply, a drain connected to a drain of said fourth nMOS transistor and an output signal line, and a gate connected to said second clock output line;
said third nMOS transistor having a source connected to said negative power supply; and
said fourth nMOS transistor having a source connected to said negative power supply, said NOR circuit comprising:
a fourth pMOS transistor having a source connected to said positive power supply, a drain connected to a drain of a fifth nMOS transistor, a drain of a sixth nMOS transistor and said data input signal line of said first DFF circuit, and a gate connected to a gate of said sixth nMOS transistor and said output signal line of said third DFF circuit;
said fifth nMOS transistor having a gate connected to a signal input terminal, and a source connected to said negative power supply; and
said sixth nMOS transistor having a source connected to said negative power supply, said NAND circuit comprising:
a fifth pMOS transistor having a source connected to said positive power supply, a drain connected to a drain of a seventh nMOS transistor and said data input signal line of said second DFF circuit, and a gate connected to a gate of said seventh nMOS transistor and said output signal line of said third DFF circuit;
said seventh nMOS transistor having a source connected to a drain of an eighth nMOS transistor; and
said eighth nMOS transistor having a source connected to said negative power supply, and a gate connected to said output signal line of said first DFF circuit, said output buffer circuit comprising:
a sixth pMOS transistor having a source connected to said positive power supply, a drain connected to a drain of a ninth nMOS transistor, a gate of a seventh pMOS transistor, a gate of a tenth nMOS transistor and said second output signal terminal, and a gate connected to a gate of said ninth nMOS transistor, said output signal line of said second DFF circuit and said data input signal line of said third DFF circuit;
said ninth nMOS transistor having a source connected to said negative power supply;
said seventh pMOS transistor having a drain connected to a drain of said tenth nMOS transistor and said first output signal terminal; and
said tenth nMOS transistor having a source connected to said negative power supply.

6. The frequency dividing circuit driven by single-phase clock according to claim 5, wherein said first current control element and said second current control element are constant-current sources, both being comprised of a MOS transistor.

7. The frequency dividing circuit driven by single-phase clock according to claim 5, wherein said first current control element and said second current control element are resistors.

8. The clock supply bias circuit of claim 2, wherein said diode is one of: a pMOS diode, an NMOS diode, a junction diode, and a TFT diode.

9. A frequency dividing circuit driven by single-phase clock, comprising: a first DFF circuit, a second DFF circuit and a third DFF circuit each consisting of a MOS transistor, a NOR circuit, a NAND circuit, an output buffer circuit and a clock supply bias circuit, all of said circuits being connected in parallel with each other between a positive power supply and a negative power supply, and said first DFF circuit, said second DFF circuit and said third DFF circuit further being constructed such that all of said DFF circuits are driven by clocks supplied by said clock supply bias circuit, said clock supply bias circuit further comprising:
a clock input terminal for receiving a clock signal and clock output terminals for outputting said clock input terminal as a first clock output line and a second clock output line, said first and second clock output lines being constructed such that said first clock and said second clock have the same phase as that of said clock signal and have different voltages;
said first DFF circuit, said second DFF circuit and said third DFF circuit being further constructed such that all of said DFF circuits consist of the same circuit configuration and each of said DFF circuits further comprises:
a first pMOS transistor having a source connected to said positive power supply, a drain connected to a drain of a first nMOS transistor and a gate of a second pMOS transistor, and a gate connected to a data input signal line and a gate of a second nMOS transistor;
said first nMOS transistor having a source connected to a drain of said second nMOS transistor, and a gate connected to a gate of a third nMOS transistor and said first clock output line;
said second pMOS transistor having a source connected to said positive power supply, and a drain connected to a drain of said third nMOS transistor and a gate of a fourth nMOS transistor;
said second nMOS transistor having a source connected to said negative power supply;
a third pMOS transistor having a source connected to said positive power supply, a drain connected to a drain of said fourth nMOS transistor and an output signal line, and a gate connected to said second clock output line;
said third nMOS transistor having a source connected to said negative power supply; and
said fourth nMOS transistor having a source connected to said negative power supply,
said NOR circuit comprising:
a fourth pMOS transistor having a source connected to said positive power supply, a drain connected to a drain of a fifth nMOS transistor, a drain of a sixth nMOS transistor and said data input signal line of said first DFF circuit, and a gate connected to a gate of said sixth nMOS transistor and said output signal line of said third DFF circuit;
said fifth nMOS transistor having a gate connected to a signal input terminal, and a source connected to said negative power supply; and
said sixth nMOS transistor having a source connected to said negative power supply,
said NAND circuit comprising:
a fifth pMOS transistor having a source connected to said positive power supply, a drain connected to a drain of a seventh nMOS transistor and said data input signal line of said second DFF circuit, and a gate connected to a gate of said seventh nMOS transistor and said output signal line of said third DFF circuit;
said seventh nMOS transistor having a source connected to a drain of an eighth nMOS transistor; and said eighth nMOS transistor having a source connected to said negative power supply, and a gate connected to said output signal line of said first DFF circuit, said output buffer circuit comprising:
a sixth pMOS transistor having a source connected to said positive power supply, a drain connected to a drain of a ninth nMOS transistor, a gate of a seventh pMOS transistor, a gate of a tenth nMOS transistor and said second output signal terminal, and a gate connected to a gate of said ninth nMOS transistor, said output signal line of said second DFF circuit and said data input signal line of said third DFF circuit;
said ninth nMOS transistor having a source connected to said negative power supply;
said seventh pMOS transistor having a drain connected to a drain of said tenth nMOS transistor and said first output signal terminal; and
said tenth nMOS transistor having a source connected to said negative power supply.

10. The frequency dividing circuit of claim 9, wherein said clock supply bias circuit further comprises:
a first capacitor connected in series to said positive power supply via a first current control element and disposed between said clock input terminal and said positive power supply;
a second capacitor connected in series to said negative power supply via a second current control element and disposed between said clock input terminal and said negative power supply;
a first resistor connected in parallel with said first capacitor; a second resistor connected in parallel with said second capacitor; and
a diode connected in parallel with said first capacitor and said second capacitor being connected in series, said clock supply bias circuit further being constructed such that an anode of said diode serves as said first clock output line, and a cathode of said diode serves as said second clock output line.

11. The frequency dividing circuit of claim 10, wherein said diode of said clock supply bias circuit is one of: a pMOS diode, an NMOS diode, a junction diode, and a TFT diode.

12. The frequency dividing circuit of claim 5, wherein said diode of said clock supply bias circuit is one of: a pMOS diode, an NMOS diode, a junction diode, and a TFT diode.

13. A frequency dividing circuit driven by single-phase clock, comprising: a first DFF circuit, a second DFF circuit and a third DFF circuit each consisting of a MOS transistor, a NOR circuit, a NAND circuit, an output buffer circuit and a clock supply bias circuit, all of said circuits being connected in parallel with each other between a positive power supply and a negative power supply, and said first DFF circuit, said second DFF circuit and said third DFF circuit further being constructed such that all of said DFF circuits are driven by clocks supplied by said clock supply bias circuit, said clock supply bias circuit further comprising:
a clock input terminal;
a first capacitor connected in series to said positive power supply via a first current control element and disposed between said clock input terminal and said positive power supply;
a second capacitor connected in series to said negative power supply via a second current control element and disposed between said clock input terminal and said negative power supply;

a first resistor connected in parallel with said first capacitor; a second resistor connected in parallel with said second capacitor; and a diode connected in parallel with said first capacitor and said second capacitor being connected in series, said clock supply bias circuit further being constructed such that an anode of said diode serves as a first clock output line; and a cathode of said diode serves as a second clock output line.

14. The frequency dividing circuit of claim 13, wherein said first DFF circuit, said second DFF circuit and said third DFF circuit being further constructed such that all of said DFF circuits consist of the same circuit configuration and each of said DFF circuits further comprises:

a first pMOS transistor having a source connected to said positive power supply, a drain connected to a drain of a first nMOS transistor and a gate of a second pMOS transistor, and a gate connected to a data input signal line and a gate of a second nMOS transistor;

said first nMOS transistor having a source connected to a drain of said second nMOS transistor, and a gate connected to a gate of a third nMOS transistor and said first clock output line;

said second pMOS transistor having a source connected to said positive power supply, and a drain connected to a drain of said third nMOS transistor and a gate of a fourth nMOS transistor;

said second nMOS transistor having a source connected to said negative power supply;

a third pMOS transistor having a source connected to said positive power supply, a drain connected to a drain of said fourth nMOS transistor and an output signal line, and a gate connected to said second clock output line;

said third nMOS transistor having a source connected to said negative power supply; and said fourth nMOS transistor having a source connected to said negative power supply, said NOR circuit comprising:

a fourth pMOS transistor having a source connected to said positive power supply, a drain connected to a drain of a fifth nMOS transistor, a drain of a sixth nMOS transistor and said data input signal line of said first DFF circuit, and a gate connected to a gate of said sixth nMOS transistor and said output signal line of said third DFF circuit;

said fifth nMOS transistor having a gate connected to a signal input terminal, and a source connected to said negative power supply; and said sixth nMOS transistor having a source connected to said negative power supply, said NAND circuit comprising:

a fifth pMOS transistor having a source connected to said positive power supply, a drain connected to a drain of a seventh nMOS transistor and said data input signal line of said second DFF circuit, and a gate connected to a gate of said seventh nMOS transistor and said output signal line of said third DFF circuit;

said seventh nMOS transistor having a source connected to a drain of an eighth nMOS transistor; and said eighth nMOS transistor having a source connected to said negative power supply, and a gate connected to said output signal line of said first DFF circuit, said output buffer circuit comprising:

a sixth pMOS transistor having a source connected to said positive power supply, a drain connected to a drain of a ninth nMOS transistor, a gate of a seventh pMOS transistor, a gate of a tenth nMOS transistor and said second output signal terminal, and a gate connected to a gate of said ninth nMOS transistor, said output signal line of said second DFF circuit and said data input signal line of said third DFF circuit;

said ninth nMOS transistor having a source connected to said negative power supply;

said seventh pMOS transistor having a drain connected to a drain of said tenth nMOS transistor and said first output signal terminal; and said tenth nMOS transistor having a source connected to said negative power supply.

15. The frequency dividing circuit of claim 13, wherein said diode of said clock supply bias circuit is one of: a pMOS diode, an NMOS diode, a junction diode, and a TFT diode.

* * * * *